United States Patent
Chen et al.

(10) Patent No.: US 10,332,913 B2
(45) Date of Patent: Jun. 25, 2019

(54) ARRAY SUBSTRATE, COLOR FILTER SUBSTRATE, AND MANUFACTURING METHODS THEREOF, DISPLAY PANEL AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Huabin Chen, Beijing (CN); Jianfeng Yuan, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 53 days.

(21) Appl. No.: 14/429,952

(22) PCT Filed: May 7, 2014

(86) PCT No.: PCT/CN2014/076950
§ 371 (c)(1),
(2) Date: Mar. 20, 2015

(87) PCT Pub. No.: WO2015/078144
PCT Pub. Date: Jun. 4, 2015

(65) Prior Publication Data
US 2016/0043103 A1    Feb. 11, 2016

(30) Foreign Application Priority Data
Nov. 28, 2013  (CN) .......................... 2013 1 0626530

(51) Int. Cl.
*G02B 5/20*     (2006.01)
*G09G 3/36*     (2006.01)
(Continued)

(52) U.S. Cl.
CPC ............ *H01L 27/124* (2013.01); *G02B 5/201* (2013.01); *G02F 1/13624* (2013.01);
(Continued)

(58) Field of Classification Search
CPC ......... G02F 1/134309; G02F 1/136286; G02F 1/133514; G02F 1/1343; G02F 1/13439;
(Continued)

(56) References Cited

U.S. PATENT DOCUMENTS

2005/0225575 A1* 10/2005 Brown Elliott ... G02F 1/133514
                                                    345/694
2008/0001902 A1*  1/2008 Kim .................... G09G 3/3648
                                                    345/100
(Continued)

FOREIGN PATENT DOCUMENTS

CN      101866633 A     10/2010
CN      102096446 A     6/2011
(Continued)

OTHER PUBLICATIONS

International Search Report dated May 7, 2014 corresponding to application No. PCT/CN2014/076950.
(Continued)

*Primary Examiner* — Jade R Chwasz
(74) *Attorney, Agent, or Firm* — Nath, Goldberg & Meyer; Joshua B. Goldberg; Daniel Bissing

(57) ABSTRACT

The invention discloses an array substrate, a color substrate, and manufacturing methods thereof, a display panel and a display device. The array substrate includes a plurality of gate lines and a plurality of data lines provided on a first base substrate to be intersected with each other, the gate lines and the data lines define a plurality of pixel units and at least part of the pixel units each provided therein with a first electrode, when the plurality of gate lines are sequentially scanned, the
(Continued)

first electrode is loaded with a first voltage signal and a region corresponding to the first electrode is in a transparent state, and when the plurality of gate lines are reversely scanned, the first electrode is loaded with a second voltage signal, and a region corresponding to the first electrode is in a non-transparent state. The invention realizes a high switchover efficiency.

14 Claims, 4 Drawing Sheets

(51) Int. Cl.
*G09G 3/38* (2006.01)
*H01L 27/12* (2006.01)
*G02F 1/1343* (2006.01)
*G02F 1/1362* (2006.01)

(52) U.S. Cl.
CPC .. *G02F 1/134309* (2013.01); *G02F 1/136286* (2013.01); *G09G 3/3607* (2013.01); *G09G 3/3648* (2013.01); *G09G 3/38* (2013.01); *H01L 27/127* (2013.01); G09G 2300/0426 (2013.01); G09G 2300/0456 (2013.01); G09G 2300/0814 (2013.01); G09G 2310/0251 (2013.01); G09G 2310/0262 (2013.01); G09G 2310/0283 (2013.01)

(58) Field of Classification Search
CPC .............. G02F 1/13452; H01L 27/124; G09G 2300/0452; G09G 3/2003; G09G 3/3607; G09G 2300/0426; G09G 3/3648; G09G 2300/0443; G09G 2340/06; G09G 2330/028; G09G 3/3291; G09G 2310/0289; G09G 3/3283; G09G 2300/0456; F21S 10/00; F21S 10/005; F21S 10/007; F21S 10/02; F21S 10/023; F21S 10/026; G02B 26/007; G02B 26/008; G02B 5/20; G02B 5/201; G02B 5/223; G02B 5/226; G02B 5/23; G02B 7/006; G03B 17/12
USPC .......................................... 359/891, 892, 890
See application file for complete search history.

(56) References Cited

U.S. PATENT DOCUMENTS

| | | | |
|---|---|---|---|
| 2008/0180372 A1* | 7/2008 | Kim | G09G 3/3677 345/87 |
| 2009/0086116 A1* | 4/2009 | Pak | G09G 3/3655 349/38 |
| 2011/0128475 A1* | 6/2011 | Park | G02F 1/133514 349/96 |
| 2013/0314452 A1 | 11/2013 | Ko | |
| 2014/0211128 A1* | 7/2014 | Yang | G02F 1/133514 349/68 |

FOREIGN PATENT DOCUMENTS

| | | | |
|---|---|---|---|
| CN | 102707487 A | | 10/2012 |
| CN | 102763055 A | | 10/2012 |
| CN | 102982777 A | | 3/2013 |
| CN | 103185983 A | * | 7/2013 |
| CN | 103185983 A | | 7/2013 |
| CN | 103617777 A | | 3/2014 |
| EP | 0 531 934 B1 | | 5/1997 |
| EP | 0531934 B1 | | 5/1997 |

OTHER PUBLICATIONS

Chinese Office Action dated Aug. 28, 2015 issued in Chinese Application No. 201310626530.2.
Written Opinion of the International Search Authority dated Aug. 13, 2014 in corresponding International Application No. PCT/CN2014/076950.

* cited by examiner

ARRAY SUBSTRATE, COLOR FILTER SUBSTRATE, AND MANUFACTURING METHODS THEREOF, DISPLAY PANEL AND DISPLAY DEVICE

This is a National Phase Application filed under 35 U.S.C. 371 as a national stage of PCT/CN2014/076950, filed May 7, 2014, an application claiming the benefit of Chinese Application No. 201310626530.2, filed Nov. 28, 2013, the content of each of which is hereby incorporated by reference in its entirety.

FIELD OF THE INVENTION

The present invention relates to the field of display technology, and particularly relates to an array substrate, a color filter substrate, and manufacturing methods thereof, a display panel and a display device.

BACKGROUND OF THE INVENTION

Recently, as the development of display technology, manufacturers successively release a series of transparent display devices, display modes of which include a transparent display mode and a non-transparent display mode. Here, the so-called transparent display refers to the mode in which an object behind a display device can be seen through the display device when a user is using the display device; and the so-called non-transparent display refers to the mode in which only an image on a display device can be seen and an object behind the display device can't be seen when a user is using the display device.

In the prior art, to realize a switchover between the transparent display and the non-transparent display of a transparent display device, the following methods are usually adopted.

Method 1, a detachable blocking device may be set behind the display device. When a user selects the transparent display, the blocking device is detached; and when a user selects the non-transparent display, the blocking device is attached.

Method 2, a color changing layer is added in the display device. When a user selects the transparent display, the color changing layer is driven so that it presents a transparent state; and when a user selects the non-transparent display, the color changing layer is driven so that it presents a non-transparent state.

However, the following shortcomings exist in the prior art.

In the prior art, to realize the switchover between the transparent display and the non-transparent display, a light blocking part (such as the blocking device or the color changing layer) is required to be additionally set in the transparent display device, so that the cost of the transparent display device in the prior art is increased. Meanwhile, the operation to switch between the transparent display and the non-transparent display in the prior art is complicated, resulting in a low switchover efficiency.

SUMMARY OF THE INVENTION

An object of the present invention is to provide an array substrate, a color filter substrate, and manufacturing methods thereof, a display panel and a display device. By adopting the technical solutions in the present invention, the switchover between the transparent display and the non-transparent display of the display device can be realized by merely changing the scanning sequence of gate lines, and thus, the operation thereof is simple, and the switchover efficiency is high.

To achieve the above object, the present invention provides an array substrate, including: a plurality of gate lines and a plurality of data lines which are provided on a first base substrate to be intersected with each other, the plurality of gate lines and the plurality of data lines defining a plurality of pixel units, and at least part of the pixel units each provided therein with a first electrode, wherein when the plurality of gate lines are sequentially scanned, the first electrodes is loaded with a first voltage signal and a region corresponding to the first electrodes is in a transparent state, and when the plurality of the gate lines are reversely scanned, the first electrode is loaded with a second voltage signal and a region corresponding to the first electrode is in a non-transparent state.

Optionally, each of the pixel units is provided therein with a second electrode, wherein when the plurality of gate lines are sequentially scanned, the second electrode is loaded with a third voltage signal, and when the plurality of gate lines are reversely scanned, the second electrode is loaded with a fourth voltage signal.

Optionally, the pixel unit provided therein with a first electrode is further provided with switch units including a first switch unit and a second switch unit, wherein the first switch unit controls the first electrode to be loaded with the first or second voltage signal, and the second switch unit controls the second electrode to be loaded with the third or fourth voltage signal.

Optionally, the first voltage signal, the third voltage signal and the fourth voltage signal are pixel voltage signals, and the second voltage signal is a common voltage signal.

Optionally, the array substrate further includes a plurality of common electrode lines, and the first switch unit includes a first switch tube, a gate of the first switch tube being connected with one corresponding gate line, a first terminal of the first switch tube being connected with one corresponding common electrode line and a second terminal of the first switch tube being connected with the first electrode, and the second switch unit includes a second switch tube and a third switch tube, a gate of the second switch tube being connected with one corresponding gate line, a first terminal of the second switch tube being connected with one corresponding data line and a second terminal of the second switch tube being connected with the first electrode; a gate of the third switch tube being connected with one corresponding gate line, a first terminal of the third switch tube being connected with one corresponding data line and a second terminal of the third switch tube being connected with the second electrode.

Optionally, the first terminal is a source electrode and the second terminal is a drain electrode.

Optionally, the area of the first electrode is smaller than or equals to the area of the second electrode.

Optionally, the switch units and the first electrode are provided within each of the pixel units being apart from one another.

To achieve the above object, the present invention provides a color filter substrate, including light blocking strips provided on a second base substrate. The light blocking strips define a plurality of pixel regions, each of the pixel regions is formed therein with a color matrix pattern, and at least part of the pixel regions each is provided therein with a transparent pattern.

Optionally, the area of the transparent pattern is smaller than or equals to the area of the color matrix pattern.

Optionally, the transparent pattern is provided in each of the pixel regions being apart from one another.

To achieve the above object, the present invention provides a display panel, including an array substrate and a color filter substrate provided opposite to each other, wherein the above described array substrate is adopted as the array substrate and the above described color filter substrate is adopted as the color filter substrate, the pixel unit is provided in correspondence with the pixel region, the first electrode is provided in correspondence with the transparent pattern, and the second electrode is provided in correspondence with the color matrix pattern.

To achieve the above object, the present invention provides a display device, including: a display panel, wherein the above described display panel is adopted as the display panel.

To achieve the above object, the present invention provides a manufacturing method of an array substrate, and the method includes the following steps of:

Step S1, forming a plurality of gate lines and a plurality of data lines on a first base substrate to be intersected with each other so that the plurality of gate lines and the plurality of data lines define a plurality of pixel units; and Step S2, forming a first electrode in each of at least part of the pixel units on the first base substrate, wherein
when the plurality of gate lines are sequentially scanned, the first electrode is loaded with a first voltage signal and a region corresponding to the first electrode is in a transparent state, and when the plurality of the gate lines are reversely scanned, the first electrode is loaded with a second voltage signal and a region corresponding to the first electrode is in a non-transparent state.

Optionally, the step S2 further includes the following step of forming a second electrode in each of the pixel units on the first base substrate, wherein
when the plurality of gate lines are sequentially scanned, the second electrode is loaded with a third voltage, and
when the plurality of gate lines are reversely scanned, the second electrode is loaded with a fourth voltage.

Optionally, the step S1 further includes the following step of forming switch units in the pixel unit formed with the first electrode so that the switch units include a first switch tube, a second switch tube and a third switch tube, wherein the first switch tube controls the first electrode to be loaded with the first or second voltage signal, and the second switch tube and the third switch tube control the second electrode to be loaded with the third or fourth voltage signal.

Optionally, each of the first switch tube, the second switch tube and the third switch tube includes a gate, a first terminal and a second terminal, and the step S1 specifically includes:
forming the plurality of gate lines and the gates of the first switch tube, the second switch tube and the third switch tube on the first base substrate;
forming a first insulating layer above the plurality of gate lines and the gates of the first switch tubes, the second switch tubes and the third switch tubes;
forming an active layer above the first insulating layer;
forming the first terminals of the first switch tube, the second switch tube and the third switch tube at one side of the active layer in each of the part of the pixel units, and forming the second terminals of the first switch tube, the second switch tube and the third switch tube at the other side of the active layer; and
forming the plurality of data lines above the first insulating layer.

Optionally, the step S2 further includes the following steps of:
forming a second insulating layer above the plurality of data lines, and
forming the first electrode and the second electrode above the second insulating layer.

Optionally, the following step is included before the Step S1: forming a common electrode on the first base substrate.

To achieve the above object, the present invention provides a manufacturing method of a color filter substrate, including the steps of:
forming light blocking strips on a second base substrate so that the light blocking strips define a plurality of pixel regions;
forming color matrix patterns on the second base substrate so that the color matrix patterns are located within the plurality of pixel regions;
forming transparent patterns on the second base substrate so that the transparent patterns are located within at least part of the plurality of pixel regions.

The present invention has the following beneficial effects:

The present invention provides an array substrate, a color filter substrate, and manufacturing methods thereof, a display panel and a display device, by changing the structures of the switch units and electrodes in the pixel units and by sequentially scanning or reversely scanning gate lines, the transparent or non-transparent display of the display device is realized. In the present invention, no external apparatus is additionally required, so that the cost is saved. Meanwhile, the operation to switch between the transparent display and the non-transparent display is simple, and the switchover efficiency is high.

DETAILED DESCRIPTION OF THE EMBODIMENTS

To make those skilled in the art better understand the technical solutions of the present invention, an array substrate, a color filter substrate, and manufacturing methods thereof, a display panel and a display device will be described in detail in conjunction with the accompanying drawings.

Embodiment 1

Figure 1:
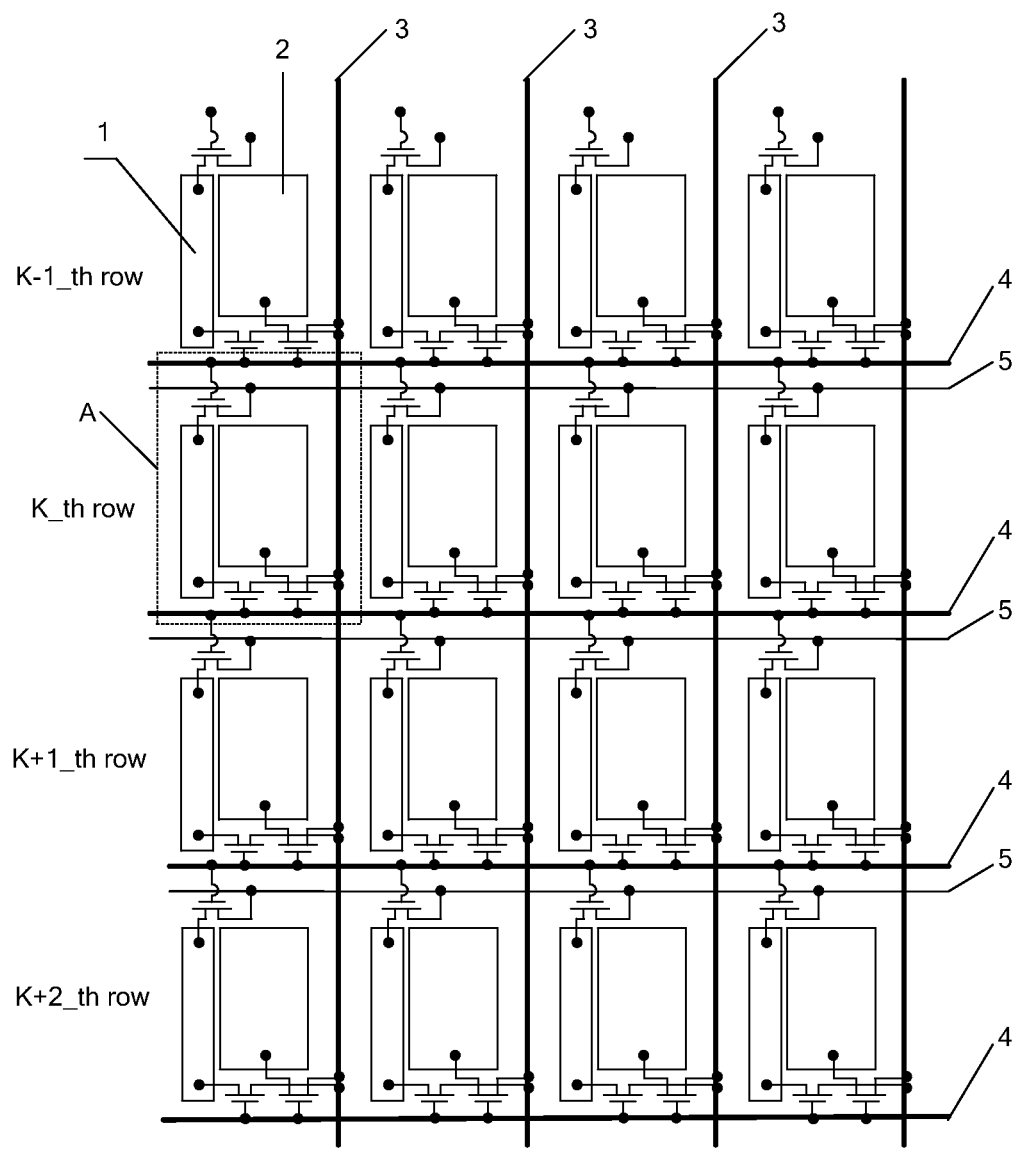
FIG. 1 is a schematic diagram of a structure of an array substrate provided by Embodiment 1 of the present invention.
Figure 2:
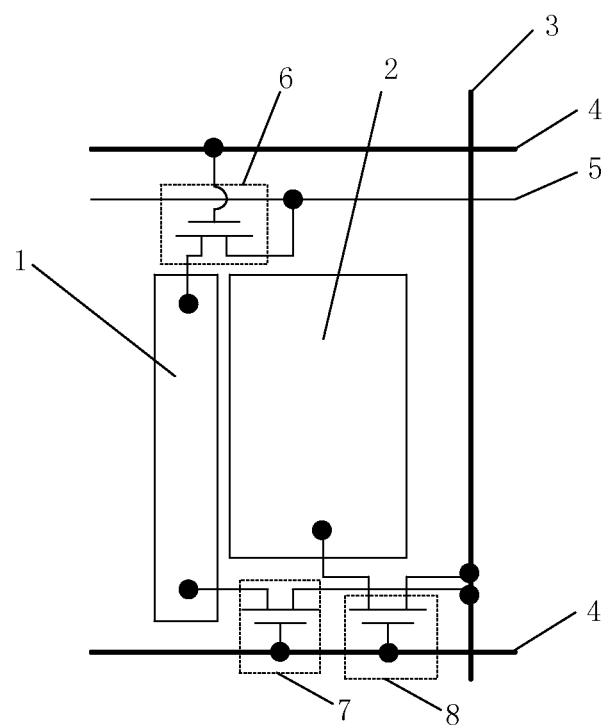
FIG. 2 is a partially enlarged view of a structure A in FIG. 1.

FIG. 1 is a schematic diagram of a structure of an array substrate provided by Embodiment 1 of the present invention, and FIG. 2 is a partially enlarged view of a structure A in FIG. 1. As shown in FIG. 1 and FIG. 2, the array substrate includes a plurality of gate lines 4 and a plurality of data lines 3, wherein the gate lines 4 and the data lines 3 define pixel units, and the pixel units each is provided therein with a second electrode 2 and switch units. A part or all of the pixel units each are provided therein with a first electrode 1, and the switch units are used for controlling the first electrode 1 and the second electrode 2 to be loaded with voltage signals. When the gate lines 4 are sequentially scanned, the first electrode 1 is loaded with a first voltage signal, and when the gate lines 4 are reversely scanned, the first electrode 1 is loaded with a second voltage signal; and when the gate lines 4 are sequentially scanned, the second electrode 2 is loaded with a third voltage signal, and when the gate lines 4 are reversely scanned, the second electrode 2 is loaded with a fourth voltage signal.

In this embodiment, the scanning sequences of the gate lines 4 include a sequential scanning and a reversed scanning. When the gate lines 4 are sequentially scanned, as shown in FIG. 1, for example, when the gate lines 4 are scanned from up to down, the first electrode 1 is loaded with a first voltage signal, while the second electrode 2 is loaded with a third voltage signal; and when the gate lines 4 are reversely scanned, as shown in FIG. 1, for example, when the gate lines 4 are scanned from down to up, the first electrode 1 is loaded with a second voltage signal, while the second electrode 2 is loaded with a fourth voltage signal.

As the scanning sequence is changed, the voltages signals loaded on the first electrode 1 and/or the second electrode 2 are changed, so that the display mode of a display device including the array substrate provided by this embodiment is changed. It is noted that the display device in this embodiment is in a normal black mode.

In this embodiment, various scanning sequences of the gate lines 4 correspond to various display modes of the display device. Specifically, sequentially scanning the gate lines 4 corresponds to the transparent display of the display device, and reversely scanning the gate lines 4 corresponds to the non-transparent display of the display device; or, sequentially scanning the gate lines 4 corresponds to the non-transparent display of the display device, and reversely scanning the gate lines 4 corresponds to the transparent display of the display device.

It will be described below in detail by taking the case that sequentially scanning the gate lines 4 corresponds to the transparent display of the display device and reversely scanning the gate lines 4 corresponds to the non-transparent display of the display device as an example.

Optionally, the first voltage signal, the third voltage signal and the fourth voltage signal are pixel voltage signals, and the second voltage signal is a common voltage signal. The switch units include a first switch unit and a second switch unit, and the first switch unit is used for controlling the first electrode 1 to be loaded with the common voltage signal, while the second switch unit is used for controlling the first electrode 1 and the second electrode 2 to be loaded with the pixel voltage signals.

Under control of different switch units, the first electrode 1 is loaded with the pixel voltage signal or the common voltage signal. In the case that the first electrode 1 is loaded with the pixel voltage signal, a display can be realized in a region corresponding to the first electrode 1 in the display device; and in the case that the first electrode 1 is loaded with the common voltage signal, the display cannot be realized in the region corresponding to the first electrode 1 in the display device. In such a case, when the region corresponding to the first electrode 1 is displaying, white light passes through the region corresponding to the first electrode 1, and this region is in a transparent state, so that the transmittance of the corresponding pixel unit is increased and the color gamut is decreased. And when the region corresponding to the first electrode 1 is not displaying, the region corresponding to the first electrode 1 transmits no light, and this region is in a non-transparent state, so that the transmittance of the corresponding pixel unit is decreased and the color gamut is increased.

Figure 3:
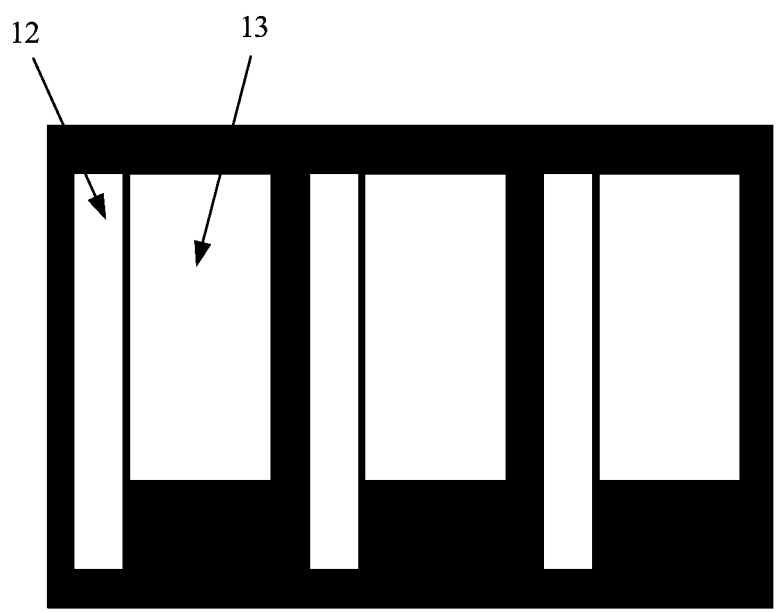
FIG. 3 is a schematic diagram illustrating a result of a transparent display of a display device including the array substrate provided by Embodiment 1.
Figure 4:
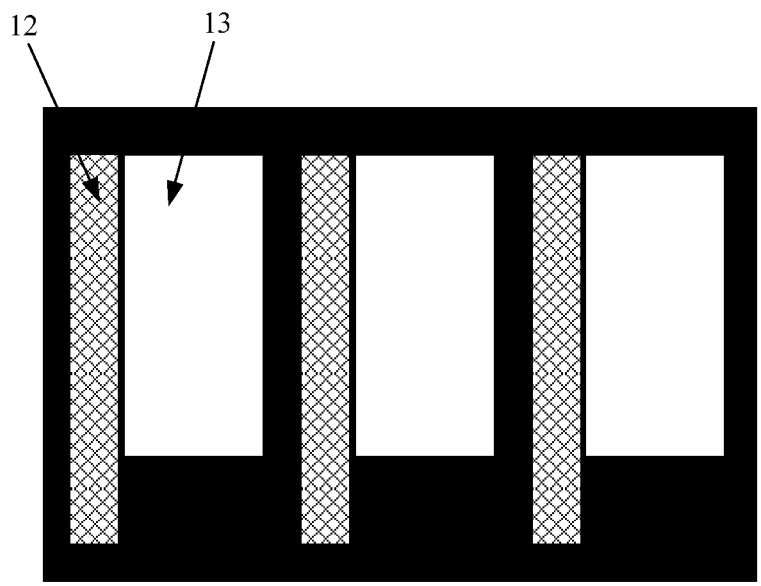
FIG. 4 is a schematic diagram illustrating a result of a non-transparent display of a display device including the array substrate provided by Embodiment 1.

FIG. 3 is a schematic diagram illustrating a result of a transparent display of a display device including the array substrate provided by Embodiment 1. As shown in FIG. 3, the region 12 corresponding to the first electrode is in a transparent state, and the region 13 corresponding to the second electrode is in a normal display. At this time, the display mode of the display device is the transparent display. FIG. 4 is a schematic diagram illustrating a result of a non-transparent display of a display device including the array substrate provided by Embodiment 1. As shown in FIG. 4, the region 12 corresponding to the first electrode is in a non-transparent state, and the region 13 corresponding to the second electrode is in a normal display. At this time, the display mode of the display device is the non-transparent display.

Referring to FIG. 1 and FIG. 2, optionally, the array substrate further includes a plurality of common electrode lines 5. The first switch unit includes a first switch tube 6. A gate of the first switch tube 6 is connected with one corresponding gate line 4, a first terminal of the first switch tube 6 is connected with one corresponding common electrode line 6 and a second terminal of the first switch tube 6 is connected with the corresponding first electrode 1.

The second switch unit includes a second switch tube 7 and a third switch tube 8;

A gate of the second switch tube 7 is connected with one corresponding gate line 4, a first terminal of the second switch tube 7 is connected with one corresponding data line 3 and a second terminal of the second switch tube 7 is connected with the corresponding first electrode 1;

A gate of the third switch tube 8 is connected with the corresponding gate line 4, a first terminal of the third switch tube 8 is connected with the corresponding data line 3 and a second terminal of the third switch tube 8 is connected with the corresponding second electrode 2; and Optionally, each of the above described first switch tube 6, second switch tube 7 and third switch tube 8 is a thin film transistor (TFT), the first terminal is a source electrode and the second terminal is a drain electrode.

It is noted that the structures of the switch units may be changed according to the actual requirements on design, and the structure with three switch tubes provided by the present invention does not constitute a limitation to the present invention. Next, the principle of the present invention will be described in detail according to the structure shown in FIG. 1.

In the process of sequentially scanning the respective gate lines 4:

When scanning a K_th gate line is completed, the first switch tubes 6 within the pixel units in the K_th row are cut-off, and the second switch tubes 7 and the third switch tubes 8 within the pixel units in the K_th row are turned on, and the first switch tubes 6 within the pixel units in the K+1_th row are turned on, and the second switch tubes 7 and the third switch tubes 8 within the pixel units in the K+1_th row are cut-off.

At this time, within the pixel units in the K−1_th row, the pixel voltage signals remain the same on the first electrodes 1, and the pixel voltage signals remain the same on the second electrodes 2; within the pixel units in the K_th row, as the second switch tubes 7 and the third switch tubes 8 are turned on, the voltage signals loaded on the first electrodes 1 are changed from the common voltage signals to the pixel voltage signals, and the second electrodes 2 start to be loaded with the pixel voltage signals; and within the pixel units in the K+1_th row, as the first switch tubes 6 are turned on, the first electrodes 1 are loaded with the common voltage signals, and meanwhile, as the second switch tubes 7 and the third switch tubes 8 are cut-off, no voltage signal is applied to the second electrodes 2.

When scanning a K+1_th gate line is completed, the first switch tubes 6 within the pixel units in the K+1_th row are cut-off, and the second switch tubes 7 and the third switch tubes 8 within the pixel units in the K+1_th row are turned on, and the first switch tubes 6 within the pixel units in the K+2_th row are turned on, and the second switch tubes 7 and the third switch tubes 8 within the pixel units in the K+2_th row are cut-off.

At this time, in the pixel units in the K−1_th row, the pixel voltage signals remain the same on the first electrodes 1, and the pixel voltage signals remain the same on the second electrodes 2; within the pixel units in the K_th row, the pixel voltage signals remain the same on the first electrodes 1, and the pixel voltage signals remain the same on the second electrodes 2; within the pixel units in the K+1_th row, as the second switch tubes 7 and the third switch tubes 8 are turned on, the voltage signals loaded on the first electrodes 1 are changed from the common voltage signals to the pixel voltage signals, and the second electrodes 2 start to be loaded with the pixel voltage signals; and within the pixel units in the K+2_th row, as the first switch tubes 6 are turned on, the first electrodes 1 are loaded with the common voltage signals, and meanwhile, as the second switch tubes 7 and the third switch tubes 8 are cut-off, no voltage signal is applied to the second electrodes 2.

After scanning of the last gate line is completed, on the array substrate, each of the first electrodes 1 is loaded with the pixel voltage signal, while each of the second electrodes 2 is loaded with the pixel voltage signal. In the display device, the regions 12 corresponding to the first electrodes transmit white light, and the regions 13 corresponding to the second electrodes transmit colored light. At this time, the display mode of the display device is the transparent display.

In the process of reversely scanning the respective gate lines 4:

When scanning a K+1_th gate line is completed, the first switch tubes 6 within the pixel units in the K+2_th row are turned on, and the second switch tubes 7 and the third switch tubes 8 within the pixel units in the K+2_th row are cut-off; the first switch tubes 6 within the pixel units in the K+1_th row are cut-off, and the second switch tubes 7 and the third switch tubes 8 within the pixel units in the K+1_th row are turned on; and within the pixel units in the K_th row, the first switch tubes 6, the second switch tubes 7 and the third switch tubes 8 are cut-off.

In the pixel units in the K+2_th row, as the first switch tubes 6 are turned on, the voltage signals loaded on the first electrodes 1 are changed from the pixel voltage signals to the common voltage signals, and as the second switch tubes 7 and the third switch tubes 8 are cut off, the pixel voltage signals are remained the same on the second electrodes 2; and within the pixel units in the K+1_th row, as the second switch tubes 7 and the third switch tubes 8 are turned on, the first electrodes 1 are loaded with the pixel voltage signals and the second electrode 2 are loaded with pixel voltage signals. Within the pixel units in the K_th row, as the first switch tubes 6, the second switch tubes 7 and the third switch tubes 8 are cut-off, no voltage signal is applied to the first electrodes 1 and the second electrodes 2.

When scanning a K_th gate line is completed, the first switch tubes 6 within the pixel units in the K+1_th row are turned on, and the second switch tubes 7 and the third switch tubes 8 within the pixel units in the K+1_th row are cut-off; the first switch tubes 6 within the pixel units in the K_th row are cut-off, and the second switch tubes 7 and the third switch tubes 8 within the pixel units in the K_th row are turned on; and within the pixel units in the K−1_th, the first switch tubes 6, the second switch tubes 7 and the third switch tubes 8 are cut-off.

In the pixel units in the K+1_th row, as the first switch tubes 6 are turned on, the voltage signals loaded on the first electrodes 1 are changed from the pixel voltage signals to the common voltage signals, and meanwhile, as the second switch tubes 7 and the third switch tubes 8 within the pixel units in the K+1_th row are cut-off, the pixel voltage signals remain the same on the second electrode 2; and within the pixel units in the K_th row, as the second switch tubes 7 and the third switch tubes 8 are turned on, the first electrodes 1 start to be loaded with the pixel voltage signals and the second electrodes 2 start to be loaded with the pixel voltage signals. Within the pixel units in the K−1_th row, as the first switch tubes 6, the second switch tubes 7 and the third switch tubes 8 are cut-off, no voltage signal is applied to the first electrodes 1 and the second electrodes 2.

When scanning of the first gate line is completed, on the array substrate, each of the first electrodes 1 is loaded with the common voltage signal, while each of the second electrodes 2 is loaded with the pixel voltage signal. In the display device, the regions 12 corresponding to the first electrodes transmit no light, and the regions 13 corresponding to the second electrodes transmit colored light. At this time, the display mode of the display device is the non-transparent display.

As described above, when the gate lines 4 are sequentially scanned, the display mode of the display device including the array substrate is the transparent display, while when the gate lines 4 are reversely scanned, the display mode of the display device including the array substrate is the non-transparent display. Since a switchover between the transparent display and the non-transparent display of the display device can be realized by merely changing the scanning sequence of the gate lines 4, the switchover is simple and the switchover efficiency is high.

It is noted that when the gate of the first switch tube 6 is connected with a gate line next to the corresponding gate line 4, the case that the corresponding display device performs the non-transparent display by sequentially scanning the gate lines 4 and performs the transparent display by reversely scanning the gate lines 4 may be realized, and the realization process of the case will not be described in detail herein.

Optionally, the area of the first electrode 1 is smaller than or equals to the area of the second electrode 2. In this embodiment, the first electrode 1 is used for controlling the switchover between the transparent display and the non-transparent display of the display device, and the second electrode 2 is used for displaying color images. In such a case, in order to ensure a better display quality of the display device, the area of the first electrode 1 may be allowed to be smaller than or equals to the area of the second electrode 2.

Optionally, the switch units and the first electrodes 1 are provided within the pixel units being apart from one another. Providing the switch units and the first electrodes in the pixel units being apart from one another can make the brightness of the whole picture in the transparent display be more uniform. It is noted that, as shown in FIG. 1, each of the pixel units is provided therein with switch units and the first electrode 1, however, it is only an example, and will not constitute a limitation to the present invention. Moreover, no corresponding drawing for illustrating the case that the switch units and the first electrodes 1 are provided within the pixel units being apart from one another is given in the present description.

Embodiment 1 of the present invention provides the array substrate, and by changing the structures of the switch units and the electrodes within the pixel units, and sequentially or reversely scanning the gate lines, the transparent display or the non-transparent display of the display device including the array substrate provided by Embodiment 1 is realized. In Embodiment 1 of the present invention, no external apparatus is additionally required, so that the cost can be effectively saved. Meanwhile, the operation to switch between the transparent display and the non-transparent display is simple, and the switchover efficiency is high.

Embodiment 2

Figure 5:
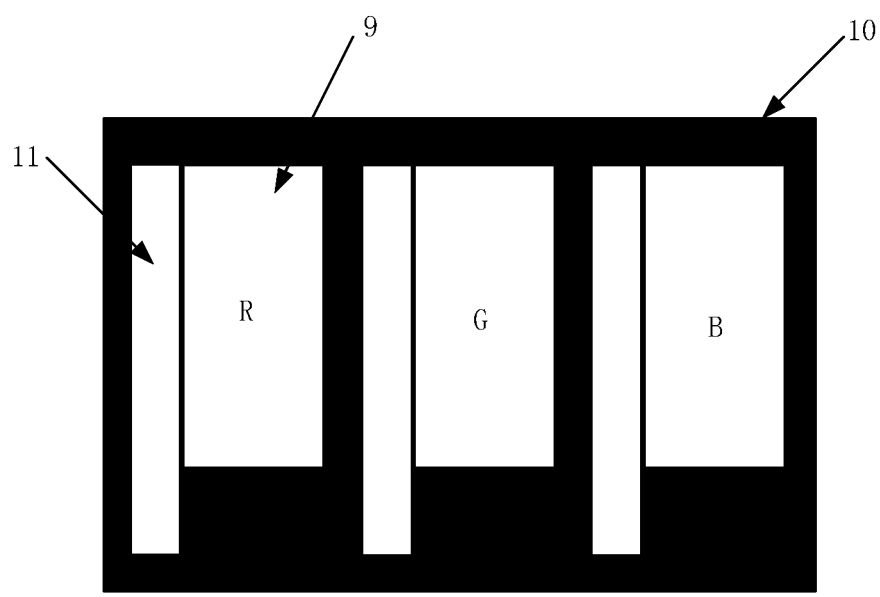
FIG. 5 is a schematic diagram of a partial structure of a color filter substrate provided by Embodiment 2 of the present invention.

FIG. 5 is a schematic diagram of a partial structure of a color filter substrate provided by Embodiment 2 of the present invention. As shown in FIG. 5, the color filter substrate includes light blocking strips 10 provided on a second base substrate, by which a plurality of pixel regions are defined. The pixel region is formed therein with a color matrix pattern 9, and at least part of the pixel regions each is formed therein with a transparent pattern 11. In the example shown in FIG. 5, three adjacent light blocking strips 10 are shown, and the three light blocking strips 10 define three pixel units.

In this case, the color matrix pattern 9 may include a red matrix pattern R, a green matrix pattern G and a blue matrix pattern B, and of course, the color matrix pattern 9 may also be a matrix pattern of any other color. Meanwhile, the light blocking strip may be a black matrix or any other unit formed with a light blocking material.

In this embodiment, in a display device including the color filter substrate provided by this embodiment, the transparent display or the non-transparent display of the display device may be realized by controlling regions corresponding to the transparent patterns 11 to transmit white light or transmit no light.

It is noted that the transparent pattern 11 may be a transparent film or a hollowed-out structure.

Optionally, the area of the transparent pattern 11 is smaller than or equals to the area of the color matrix pattern 9. As the region corresponding to the transparent pattern 11 transmits only white light or no light and the region corresponding to the color matrix pattern 9 is used for displaying a color image, the area of the transparent pattern 11 may be allowed to be smaller than or equal to the area of the color matrix pattern 9, so as to ensure the display effect of the display device.

Optionally, the transparent patterns 11 are provided in the pixel regions being apart from one another. Providing the transparent patterns 11 in the pixel regions being apart from one another can make the brightness of a whole picture in the transparent display be more uniform.

Embodiment 2 of the present invention provides the color filter substrate, and the transparent or non-transparent display of the display device including the color filter substrate provided by this Embodiment 2 is realized by adding transparent patterns in pixel regions.

Embodiment 3

Embodiment 3 of the present invention provides a display panel, including an array substrate and a color filter substrate provided opposite to each other, wherein the array substrate provided by Embodiment 1 is adopted as the array substrate, the color filter substrate provided by Embodiment 2 is adopted as the color filter substrate, the pixel unit is provided in correspondence with the pixel region, the first electrode is provided in correspondence with the transparent pattern and the second electrode is provided in correspondence with the color matrix pattern. The details thereof may refer to the descriptions of Embodiments 1 and 2, and will not be redundantly described herein.

It is noted that, the display panel in Embodiment 3 includes any one of a Twisted Nematic (TN) panel, a Vertical Alignment (VA) panel, an In-Plane Switching (IPS) panel and a Fringe Field Switching (FFS) panel.

Embodiment 3 of the present invention provides a display panel, including an array substrate and a color filter substrate provided opposite to each other, wherein the first electrode and corresponding switch units are provided on the array substrate, the transparent pattern is provided on the color filter substrate, and the first electrode is provided in correspondence with the transparent pattern. The transparent or non-transparent display of a display device including the display panel provided by Embodiment 3 is realized by sequentially or reversely scanning the gate lines. The display panel provided by Embodiment 3 of the present invention is not additionally provided with any external apparatus, so that the cost can be effectively saved. Meanwhile, the operation to switch between the transparent display and the non-transparent display is simple, and the switchover efficiency is high.

Embodiment 4

Embodiment 4 of the present invention provides a display device, including a display panel, wherein the display panel provided by Embodiment 3 is adopted as the display panel. The details thereof may refer to the description of Embodiment 3, and will not be described herein.

Specifically, Embodiment 4 of the present invention provides a display device including a display panel, the display panel includes an array substrate and a color filter substrate provided opposite to each other, wherein the first electrode and corresponding switch units are provided on the array substrate, the transparent pattern is provided on the color filter substrate, and the first electrode is provided in correspondence with the transparent pattern. The transparent or non-transparent display of the display device is realized by sequentially or reversely scanning the gate lines. The display device provided by Embodiment 4 of the present invention is not additionally provided with any external apparatus, so that the cost can be effectively saved. Meanwhile, the operation to switch between the transparent display and the non-transparent display is simple, and the switchover efficiency is high.

Embodiment 5

Figure 6:
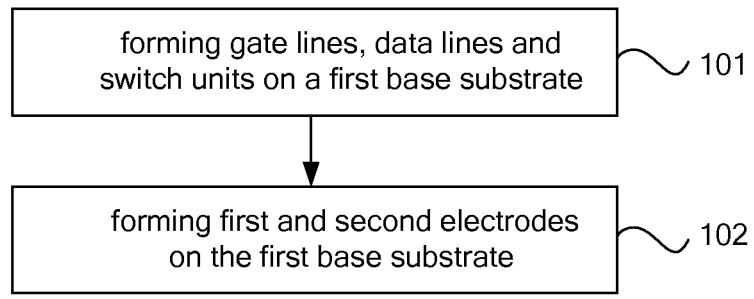
FIG. 6 is a flowchart of a manufacturing method of an array substrate provided by Embodiment 5 of the present invention.

FIG. 6 is a flowchart of a manufacturing method of an array substrate provided by Embodiment 5 of the present invention. As shown in FIG. 6, the manufacturing method includes the following steps 101 and 102.

Step 101, forming a plurality of gate lines, a plurality of data lines and a plurality of switch units on a first base substrate.

Wherein, the switch units includes a first switch tube, a second switch tube and a third switch tube, each of which includes a gate, a first terminal and a second terminal. The plurality of gate lines and the plurality of data lines define a plurality of pixel units. Optionally, the step 101 specifically includes the following steps 1011 to 1015.

Step 1011, forming the plurality of gate lines and the gates of the first switch tube, the second switch tube and the third switch tube on the first base substrate.

Specifically, a conductive film layer is formed on the first base substrate, and then the plurality of gate lines and the gates of the first switch tube, the second switch tube and the third switch tube are formed by a patterning process.

Step 1012, forming a first insulating layer above the plurality of gate lines and the gates of the first switch tube, the second switch tube and the third switch tube.

Step 1013, forming an active layer above the first insulating layer.

Specifically, an active material layer is formed on the first insulating layer, and then the pattern of the active layer is formed by a patterning process.

Step 1014, forming the first terminals of the first switch tube, the second switch tube and the third switch tube at one side of the active layer, and forming the second terminals of the first switch tube, the second switch tube and the third switch tube at the other side of the active layer.

Specifically, a metal material layer is deposited on the first insulating layer, and then the first and second terminals of the first switch tube, the second switch tube and the third switch tube are formed by a patterning process. The first and second terminals of the first switch tube, the second switch tube and the third switch tube are respectively located at both sides of the active layer. The first and second terminals of the first switch tube, the second switch tube and the third switch tube are respectively connected with both sides of the active layer.

Step 1015, forming the plurality of data lines above the first insulating layer.

A conductive film layer is formed on the first insulating layer, and then the plurality of data lines are formed by a patterning process, so that the data line is connected with the first terminals of the second and third switch tubes. It is noted that the steps 1014 and 1015 may be performed simultaneously.

In the above described steps, the switch units may be formed with the gate lines and the data lines simultaneously.

It is noted that the first switch tube, the second switch tube and the third switch tube formed in the above order are bottom-gate-type switch tubes, however, in this embodiment, the first switch tube, the second switch tube and the third switch tube may be top-gate-type switch tubes by changing the order of the above described steps.

Step 102, forming the first electrode and the second electrode on the first base substrate.

Specifically, the step 102 includes the following steps of:
step 1021, forming a second insulating layer above the data lines, and
step 1022, forming the first electrode and the second electrode on the second insulating layer.

Specifically, an electrode base material layer is provided on the second insulating layer, and the first electrode and the second electrode are formed by processing the electrode base material with a magnetron sputtering process. The first electrode and the second electrode are located within the pixel unit, wherein the first electrode is loaded with the first voltage signal when the gate lines are sequentially scanned and is loaded with the second voltage signal when the gate lines are reversely scanned, while the second electrode is loaded with the third voltage signal when the gate lines are sequentially scanned and is loaded with the fourth voltage signal when the gate lines are reversely scanned.

In this case, the first electrode is insulated from the second electrode. Optionally, both the material of the first electrode and the material of the second electrode are Indium Tin Oxides (ITOs).

It is noted that the above described patterning process includes photoresist coating, exposure, development, etching, photoresist stripping and the like.

Embodiment 5 of the present invention provides the manufacturing method of an array substrate, wherein a first substrate is provided thereon with first electrodes. The voltage signal loaded on the first electrode is changed in a manner of sequentially or reversely scanning gate lines, so that the display mode of a region corresponding to the first electrode is changed, and the transparent display or non-transparent display of a display panel is realized. The array substrate manufactured by using the method provided by Embodiment 5 of the present invention adds no extra apparatus, and thus the cost can be effectively saved. Meanwhile, when a switch over between the transparent display and the non-transparent display is performed, the operation thereof is simple and the efficiency of the switch over is high.

Embodiment 6

Embodiment 6 provides a manufacturing method of an array substrate, including the following steps of 201 to 203.

Step 201, forming a common electrode on a first base substrate.

Specifically, an electrode base material layer is formed on the first base substrate, and the common electrode is formed by a magnetron sputtering process. It is noted that a third insulating layer may be formed above the common electrode in order to allow the common electrode to be insulated from the gate lines, the data lines and the switch units.

Step 202, forming gate lines, data lines and switch units on the first base substrate.

Step 203, forming a first electrode and a second electrode on the first base substrate.

The specific processes of steps 202 and 203 can refer to those of the steps 101 and 102 in the above described Embodiment 1, and will not be described herein.

In Embodiment 6, the step 201 is performed first, then the step 202 is performed, and the step 203 is performed finally, so that the common electrode is not located in the same plane as the first electrode and the second electrode. The array substrate manufactured in the above order is the array substrate in a FSS type panel.

Optionally, the step 202 is performed first, and then the steps 201 and 203 are performed simultaneously, so that the common electrode, the first electrode and the second electrode are located in the same plane. The array substrate manufactured in the above order is the array substrate in an IPS type panel.

It is noted that the array substrate in Embodiment 1 may be realized by the manufacturing method provided by Embodiment 5 or 6.

Embodiment 6 of the present invention provides the manufacturing method of an array substrate, wherein the first electrode is provided on the first base substrate. The voltage signal loaded on the first electrode is changed by sequentially or reversely scanning the gate lines, so that the display mode of a region corresponding to the first electrode is changed, and the transparent display or non-transparent display of a display panel is realized. The array substrate manufactured by using the manufacturing method provided by Embodiment 5 of the present invention is not additionally provided with any external apparatus, and thus the cost can be effectively saved. Meanwhile, the operation to switch between the transparent display and the non-transparent display is simple and the switchover efficiency is high.

Embodiment 7

Figure 7:
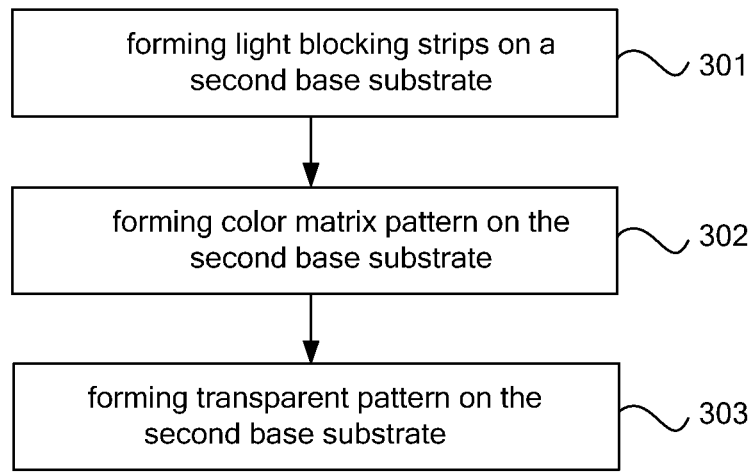
FIG. 7 is a flowchart of a manufacturing method of a color filter substrate provided by Embodiment 7 of the present invention.

FIG. 7 is a flowchart of a manufacturing method of a color filter substrate provided by Embodiment 7 of the present invention. As shown in FIG. 7, the manufacturing method includes the following steps of 301 to 303.

Step 301, forming light blocking strips on a second base substrate.

Specifically, a light blocking strip base material layer is provided on the second base substrate, and the light blocking strips are formed by processing the light blocking strip base material with a patterning process, wherein the light blocking strips define pixel regions.

Step 302, forming color matrix patterns on the second base substrate.

Specifically, a color matrix pattern base material layer is provided on the second base substrate, and the color matrix patterns are formed by processing the color matrix pattern base material with a patterning process, wherein the color matrix patterns are located within the pixel regions.

Step 303, forming transparent patterns on the second base substrate.

Specifically, the color matrix patterns are processed again with a patterning process to form the transparent patterns which is of a hollowed-out structure. Of course, the hollowed-out structure may be provided with a transparent film layer thereon, and in this case, the transparent pattern is from the transparent film.

It is noted that the steps 302 and 303 may be performed simultaneously, that is to say, in a case where the color matrix pattern base material is processed with a patterning process, the color matrix patterns and the transparent patterns are formed simultaneously.

Further, the color filter substrate in Embodiment 2 can be realized by the manufacturing method provided by Embodiment 7.

Embodiment 7 of the present invention provides the manufacturing method of a color filter substrate. The pixel region of the color filter substrate manufactured by the manufacturing method provided by Embodiment 7 of the present invention is formed therein with a transparent pattern, and the transparent display or the non-transparent display of a display device can be realized by this transparent pattern.

It should be understood that the forgoing embodiments are merely exemplary embodiments used for explaining the principle of the present invention, but the present invention is not limited thereto. Various modifications and improvements may be made by those skilled in the art without departing from the spirit and essence of the present invention. These modifications and improvements shall fall within the protection scope of the present invention.

What is claimed is:

1. An array substrate, including: a plurality of gate lines and a plurality of data lines provided on a first base substrate to be intersected with each other, the plurality of gate lines and the plurality of data lines defining a plurality of pixel units, each of the pixel units is configured to display one color and is provided therein with a second electrode which is configured to drive a portion of the pixel unit corresponding thereto to display a color image, and at least one of the pixel units is further provided therein with a first electrode, the first electrode and the second electrode are formed in a same layer and in parallel to each other, wherein
when the plurality of gate lines are sequentially scanned, the first electrode is loaded with a first voltage signal, and a region corresponding to the first electrode is in a transparent state,
when the plurality of gate lines are reversely scanned, the first electrode is loaded with a second voltage signal, and a region corresponding to the first electrode is in a non-transparent state,
the at least one pixel unit provided therein with a first electrode is further provided with switch units, which include a first switch unit and a second switch unit, and wherein the first switch unit controls the first electrode to be loaded with the first or second voltage signal, and the second switch unit controls the second electrode to be loaded with a third or a fourth voltage signal, and wherein
the array substrate further comprises a plurality of common electrode lines, and the first switch unit includes a first switch tube, a gate of the first switch tube being connected with one corresponding gate line, a first terminal of the first switch tube being connected with one corresponding common electrode line and a second terminal of the first switch tube being connected with the first electrode, and
the second switch unit includes a second switch tube and a third switch tube, a gate of the second switch tube being connected with one corresponding gate line, a first terminal of the second switch tube being connected with one corresponding data line and a second terminal of the second switch tube being connected with the first electrode; and
a gate of the third switch tube being connected with one corresponding gate line, a first terminal of the third switch tube being connected with one corresponding data line and a second terminal of the third switch tube being connected with the second electrode.

2. The array substrate according to claim 1, wherein
when the plurality of gate lines are sequentially scanned, the second electrode is loaded with the third voltage signal, and
when the plurality of gate lines are reversely scanned, the second electrode is loaded with the fourth voltage signal.

3. The array substrate according to claim 1, wherein the first voltage signal, the third voltage signal and the fourth voltage signal are pixel voltage signals, and the second voltage signal is a common voltage signal.

4. The array substrate according to claim 1, wherein the first terminal is a source electrode and the second terminal is a drain electrode.

5. The array substrate according to claim 1, wherein the switch units and the first electrode are provided within each of the pixel units being apart from one another.

6. A display panel, including an array substrate and a color filter substrate provided opposite to each other, the array substrate according to claim 1 is adopted as the array substrate, wherein the color filter substrate includes light blocking strips provided on a second base substrate, the light block strips defining a plurality of pixel regions, each of the pixel regions being formed therein with a color matrix pattern, and at least part of the pixel regions each further provided therein with a transparent pattern, and the color filter substrate is adopted as the color filter substrate, the pixel unit of the array substrate is provided in correspondence with the pixel region of the color filter substrate, the first electrode of the array substrate is provided in correspondence with the transparent pattern of the color filter substrate and the second electrode of the array substrate is provided in correspondence with the color matrix pattern of the color filter substrate.

7. A display device, including the display panel according to claim 6.

8. A display control method for the array substrate of claim 1, comprising:
when the plurality of gate lines are sequentially scanned, the first electrode is loaded with the first voltage signal and a region corresponding to the first electrode is in a transparent state; and
when the plurality of the gate lines are reversely scanned, the first electrode is loaded with the second voltage signal and a region corresponding to the first electrode is in a non-transparent state.

9. A manufacturing method of an array substrate, including steps of:
S1, forming a plurality of gate lines and a plurality of data lines on a first base substrate to be intersected with each other so that the plurality of gate lines and the plurality of data lines define a plurality of pixel units, wherein each of the pixel units displays one color; and
S2, forming a second electrode in each of the pixel units on the first base substrate, and forming a first electrode in at least one of the pixel units on the first base substrate, wherein the first electrode is parallel to the second electrode and is used only for a transparent or non-transparent display, wherein
when the plurality of gate lines are sequentially scanned, the first electrode is loaded with a first voltage signal and a region corresponding to the first electrode is in a transparent state, and when the plurality of the gate lines are reversely scanned, the first electrode is loaded with a second voltage signal and a region corresponding to the first electrode is in a non-transparent state, wherein
the manufacturing method of an array substrate further comprising steps of:
providing a switch unit in the pixel unit provided therein with the first electrode, the switch unit including a first switch unit and a second switch unit, the first switch unit controls the first electrode to be loaded with the first or second voltage signal, and the second switch unit controls the second electrode to be loaded with the third or fourth voltage signal, and
forming a plurality of common electrode lines on the first base substrate, wherein
the first switch unit comprises a first switch tube, a gate of the first switch tube being connected with one corresponding gate line, a first terminal of the first switch tube being connected with one corresponding common electrode line and a second terminal of the first switch tube being connected with the first electrode, and the second switch unit includes a second switch tube and a third switch tube, a gate of the second switch tube being connected with one corresponding gate line, a first terminal of the second switch tube being connected with one corresponding data line and a second terminal of the second switch tube being connected with the first electrode; and
a gate of the third switch tube being connected with one corresponding gate line, a first terminal of the third switch tube being connected with one corresponding data line and a second terminal of the third switch tube being connected with the second electrode.

10. The manufacturing method according to claim 9, wherein
when the plurality of gate lines are sequentially scanned, the second electrode is loaded with a third voltage, and
when the plurality of gate lines are reversely scanned, the second electrode is loaded with a fourth voltage.

11. The manufacturing method according to claim 10, wherein the step S1 further includes a step of forming switch units in the pixel unit formed with the first electrode so that the switch units include a first switch tube, a second switch tube and a third switch tube, wherein
the first switch tube controls the first electrode to be loaded with the first or second voltage signal, and the second switch tube and the third switch tube control the second electrode to be loaded with the third or fourth voltage signal.

12. The manufacturing method according to claim 11, wherein each of the first switch tube, the second switch tube and the third switch tube includes a gate, a first terminal and a second terminal, the step S1 includes steps of:
forming the plurality of gate lines and the gates of the first switch tube, the second switch tube and the third switch tube on the first base substrate;
forming a first insulating layer above the plurality of gate lines and the gates of the first switch tube, the second switch tube and the third switch tube;
forming an active layer above the first insulating layer;
forming the first terminals of the first switch tube, the second switch tube and the third switch tube at one side of the active layer in each of the part of the pixel units, and forming the second terminals of the first switch tube, the second switch tube and the third switch tube at the other side of the active layer; and
forming the plurality of data lines above the first insulating layer.

13. The manufacturing method according to claim 12, wherein the step S2 further includes steps of:
forming a second insulating layer on the plurality of data lines, and
forming the first electrode and the second electrode on the second insulating layer.

14. The manufacturing method according to claim 12, before the step S1, further including step of:
forming a common electrode on the first base substrate.

* * * * *